US010199737B2

(12) United States Patent
Matitsine

(10) Patent No.: US 10,199,737 B2
(45) Date of Patent: Feb. 5, 2019

(54) MAGNETO-DIELECTRIC MATERIAL WITH LOW DIELECTRIC LOSSES

(71) Applicant: Matsing Inc., Irvine, CA (US)

(72) Inventor: Serguei Matitsine, Irvine, CA (US)

(73) Assignee: Matsing, Inc., Irvine, CA (US)

( * ) Notice: Subject to any disclaimer, the term of this patent is extended or adjusted under 35 U.S.C. 154(b) by 0 days.

(21) Appl. No.: 15/727,511

(22) Filed: Oct. 6, 2017

(65) Prior Publication Data

US 2018/0034160 A1 Feb. 1, 2018

Related U.S. Application Data

(62) Division of application No. 14/708,143, filed on May 8, 2015.

(60) Provisional application No. 61/991,366, filed on May 9, 2014.

(51) Int. Cl.
*H05K 3/36* (2006.01)
*H01Q 15/00* (2006.01)
*H01F 1/01* (2006.01)

(52) U.S. Cl.
CPC ............. *H01Q 15/006* (2013.01); *H01F 1/01* (2013.01); *H01Q 15/0026* (2013.01); *Y10T 29/49886* (2015.01)

(58) Field of Classification Search
CPC .... H01Q 15/006; H01Q 15/0026; H01Q 1/36; H01Q 1/42; H01F 1/01; Y10T 29/49128; Y10T 29/47899
USPC ............................................ 29/830, 831, 412
See application file for complete search history.

(56) References Cited

U.S. PATENT DOCUMENTS

| | | | | |
|---|---|---|---|---|
| 6,581,276 | B2 * | 6/2003 | Chung | H01Q 1/36 29/825 |
| 8,114,489 | B2 * | 2/2012 | Nemat-Nasser | H01Q 1/42 343/785 |
| 8,518,537 | B2 | 8/2013 | Matitsine | |
| 8,723,722 | B2 | 5/2014 | Fuller et al. | |
| 2004/0104847 | A1 | 6/2004 | Killen et al. | |
| 2012/0228563 | A1 | 9/2012 | Fuller et al. | |

FOREIGN PATENT DOCUMENTS

EP 0309982 A2 4/1989

* cited by examiner

*Primary Examiner* — Donghai D Nguyen
(74) *Attorney, Agent, or Firm* — Fish IP Law, LLP

(57) ABSTRACT

Materials that exhibit magneto-dielectric effects with high local order in the form of distinct basic units with a defined geometry that provides orientation and spacing that prevents contact between conductive components of a basic unit are disclosed. Use of multiple basic units arranged, for example by embedment, in essentially random orientation relative to one another provides a composite material with magneto-dielectric effects that isotropic and homogeneous. Such basic units are readily manufacturable using conventional techniques.

12 Claims, 2 Drawing Sheets

FIG. 1
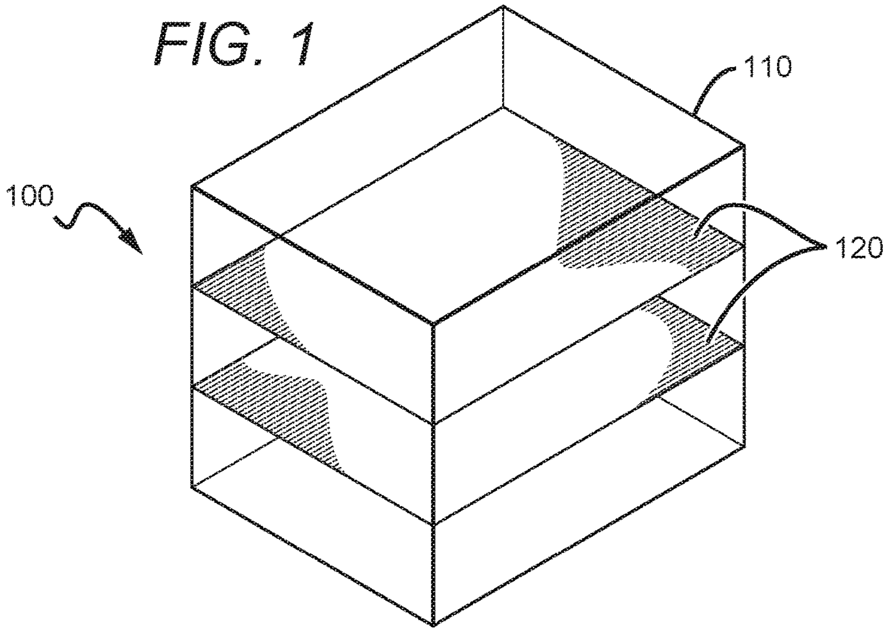
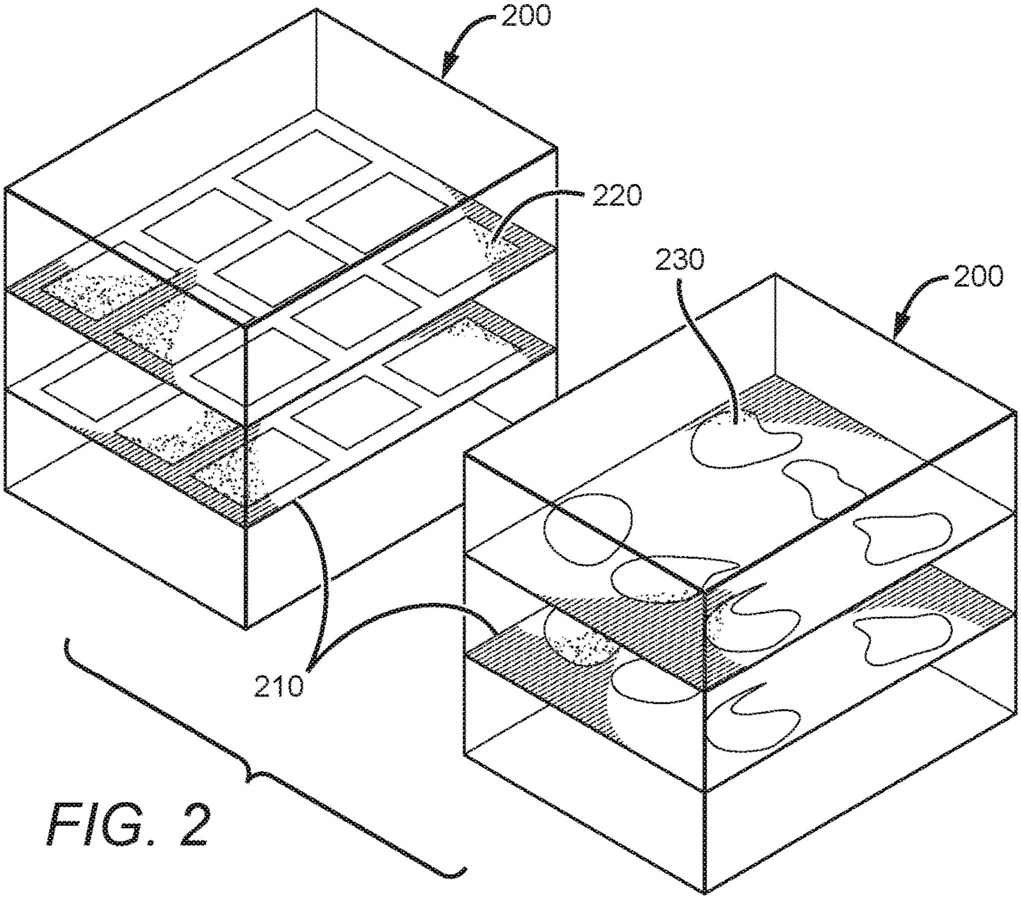
FIG. 2

FIG. 3
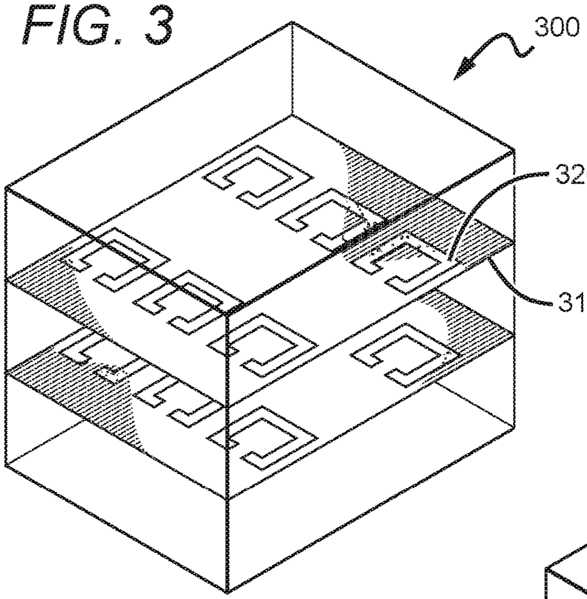
FIG. 4
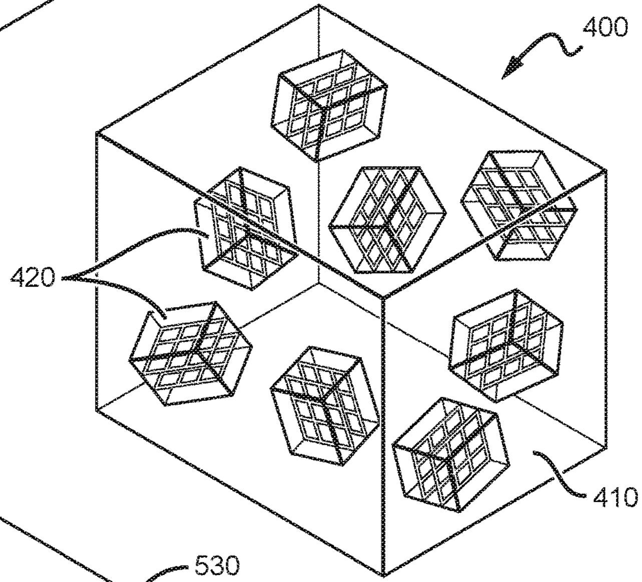
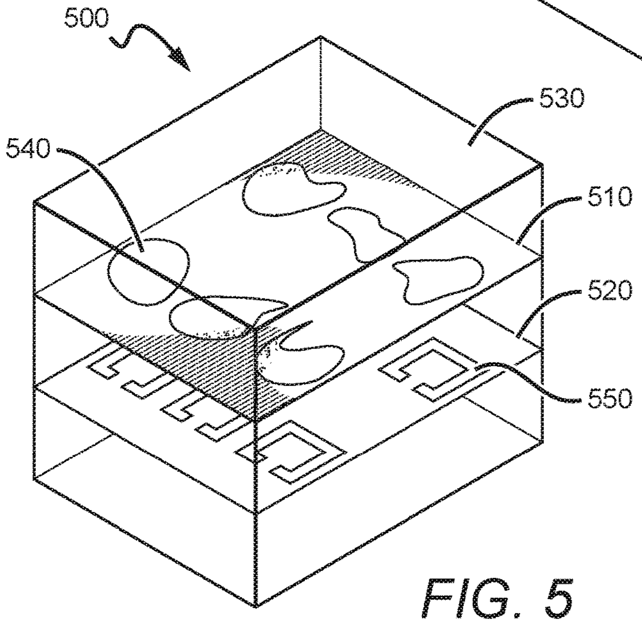
FIG. 5

MAGNETO-DIELECTRIC MATERIAL WITH LOW DIELECTRIC LOSSES

This application is a divisional application of U.S. patent application Ser. No. 14/708,143, filed May 8, 2015, and claims the benefit of U.S. Provisional Utility Application No. 61/991,366, filed on May 9, 2014. These and all other referenced extrinsic materials are incorporated herein by reference in their entirety. Where a definition or use of a term in a reference that is incorporated by reference is inconsistent or contrary to the definition of that term provided herein, the definition of that term provided herein is deemed to be controlling.

FIELD OF THE INVENTION

The field of the invention is artificial magneto-dielectric materials.

BACKGROUND

The following description includes information that may be useful in understanding the present invention. It is not an admission that any of the information provided herein is prior art or relevant to the presently claimed invention, or that any publication specifically or implicitly referenced is prior art.

Artificial magneto-dielectric materials have a wide range of uses. The typical approach to manufacturing these materials is mixing conductive particles (for example, metallic fibers, flakes, spheres, etc) in a polymer matrix, such that the conductive particles are in a random orientation. For example, United States Patent Application Publication No. 2004/0104847 (to Killen et al) describes the use of an antenna dielectric incorporates magnetic particles into voids within the dielectric material. All publications identified herein are incorporated by reference to the same extent as if each individual publication or patent application were specifically and individually indicated to be incorporated by reference. Where a definition or use of a term in an incorporated reference is inconsistent or contrary to the definition of that term provided herein, the definition of that term provided herein applies and the definition of that term in the reference does not apply. The disadvantage of such materials is that these particles can create conductive clusters (for example, by contacting each other) and as a result exhibit high electro-magnetic losses and non-homogeneity. This restricts the use of such materials in applications such as electro-magnetic lenses for antenna applications, where low loss and uniformity (homogeneity) are critical requirements.

U.S. Pat. No. 8,518,537 (to Matitsine) discusses antennas having a dielectric material made from discrete units of dielectric material with conductive fibers and/or wires embedded within them. However, the use of essentially one-dimensional wires in such devices limits their dielectric permittivity, and requires the use of large numbers of individual units to provide an effectively isotropic effect. The resulting devices are therefore relatively large and inefficient. In addition, such devices do not permit control of magneto-dielectric properties.

United States Patent Application Publication No. 2012/0228563 (to Fuller et al) describes the use of composite materials for a variety of RF applications. The described composite materials include an interstitial material with ordered arrays of inclusion materials, where the interstitial and inclusion materials have differing permittivity and permeability characteristics. Alternatively, magneto-dielectric materials in the form of sheets are known. Such materials, however, do not provide isotropic effects, which greatly limits their utility in RF lenses and antennas. Similarly, in the case of particulate materials the surrounding milieu is often non-uniform in regards to magneto-dielectric materials, resulting in a loss of focus in smaller resonance frequency bands.

It should also be appreciated that such devices display only dielectric properties, where the use of a material that has both magnetic and dielectric properties can provide advantages over material with only dielectric properties, especially when used for antenna applications (for example for phase shifters).

Thus, there is still a need for an effective magneto-dielectric material that minimal dielectric losses.

SUMMARY OF THE INVENTION

The inventive subject matter provides a dielectric and magnetic-dielectric materials, and methods for producing dielectric and magnetic-dielectric materials material. Such materials include two or more basic units, where each basic unit includes one or more sheet(s) of conductive, or magnetic material. Suitable conductive or magnetic materials include copper, nickel, aluminum, and ferrous materials. These basic units are imbedded or otherwise distributed in a material matrix in random or essentially random orientations relative to one another. In some embodiments a sheet can include two or more patches (for example, semi-circular patches) that have conductive or magnetic properties that differ from those of the surrounding sheet material. Basic units of the inventive concept include a unit matrix (for example, a nonconductive polymer) that supports the one or more sheets. In some embodiments the material matrix and the unit matrix are made of the same material. Basic units can range in size from 0.1 mm to 20 mm, and can include from 1 sheet to 20 sheets.

Another embodiment of the inventive concept is a method for manufacturing a dielectric or magnetic-dielectric material. In such a method an initial, planar layer of an insulating material is coated on one side with a layer of conductive, and/or magnetic material. This can be accomplished, for example, by application of a foil or film, sputtering, or application of particulates. Another layer of insulating material is then applied to generate a laminar intermediate. In some embodiments the application of conductive and/or magnetic layer(s) and the insulating layer(s) is repeated. The laminar intermediate is divided into multiple basic units (for example, by cutting). These basic units are imbedded in an insulating matrix such that the basic units are oriented essentially randomly to each other to produce the material.

Various objects, features, aspects and advantages of the inventive subject matter will become more apparent from the following detailed description of preferred embodiments, along with the accompanying drawing figures in which like numerals represent like components.

BRIEF DESCRIPTION OF THE DRAWINGS

FIG. 1 depicts a basic unit of the inventive concept, showing two sheets imbedded in a matrix.

FIG. 2 depicts basic units showing regular (left) and irregular (right) patches.

FIG. 3 depicts an example of a basic unit with sheets having semi-circular patches.

FIG. 4 depicts randomly oriented basic units in a final material.

FIG. 5 depicts an example of a basic unit with two sheets having different patch configurations.

DETAILED DESCRIPTION

In materials and devices of the inventive concept, materials are provided that exhibit magneto-dielectric effects with high local order in the form of distinct basic units with a defined geometry that provides orientation and spacing that prevents contact between conductive components of a basic unit. Use of multiple basic units arranged, for example by embedment, in essentially random orientation relative to one another provides a composite material with magneto-dielectric effects that isotropic and homogeneous. Such basic units are readily manufacturable using conventional techniques.

In some embodiments, the numbers expressing quantities of ingredients, properties such as concentration, reaction conditions, and so forth, used to describe and claim certain embodiments of the invention are to be understood as being modified in some instances by the term "about." Accordingly, in some embodiments, the numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the invention are approximations, the numerical values set forth in the specific examples are reported as precisely as practicable. The numerical values presented in some embodiments of the invention may contain certain errors necessarily resulting from the standard deviation found in their respective testing measurements.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

Unless the context dictates the contrary, all ranges set forth herein should be interpreted as being inclusive of their endpoints, and open-ended ranges should be interpreted to include only commercially practical values. Similarly, all lists of values should be considered as inclusive of intermediate values unless the context indicates the contrary.

The recitation of ranges of values herein is merely intended to serve as a shorthand method of referring individually to each separate value falling within the range. Unless otherwise indicated herein, each individual value with a range is incorporated into the specification as if it were individually recited herein. All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all Markush groups used in the appended claims.

The following discussion provides many example embodiments of the inventive subject matter. Although each embodiment represents a single combination of inventive elements, the inventive subject matter is considered to include all possible combinations of the disclosed elements. Thus if one embodiment comprises elements A, B, and C, and a second embodiment comprises elements B and D, then the inventive subject matter is also considered to include other remaining combinations of A, B, C, or D, even if not explicitly disclosed.

As used herein, and unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously.

The inventive subject matter provides apparatus, systems and methods in which a magneto-dielectric material is provided as a plurality of regularly shaped basic units (for example, cubes, spheres, and/or polyhedrons) that each contain one or more conductive sheets. In some embodiments all basic units have the same or similar shapes. In other embodiments the basic units incorporated into the final material have two or more configurations. Each basic unit provides local order necessary for effective modulation of dielectric permittivity along the plane defined by the imbedded sheet of the basic unit. A plurality of basic units can then be arranged, for example in random or effectively random orientations relative to one another, to provide an assemblage that effectively aggregates these local effects to provide an overall isotropic effect. Such an isotropic effect can be provided using as few as two sheet-containing basic units wherein the individual basic units are arranged such that the planes of the sheets imbedded therein are at right angles to one another. It should be appreciated that in order to provide a similar degree of isotropic effect, a minimum of three basic units containing conductive wires, which exhibit dielectric phenomena in only a single linear dimension, are required.

Surprisingly, the Inventor has found that individual basic units containing a single imbedded sheet of conductive material provides significantly enhanced performance relative to an individual basic unit containing multiple wires of the same conductive material. In a typical study, the properties of two 3 mm×3 mm basic units containing copper conductive materials were characterized. A wire-containing basic unit that included 10 copper wires with a diameter of 25 μm arranged in parallel, planar fashion and spaced at 0.3 mm intervals across the basic unit was found to have a permittivity of 1.2. A similar basic unit containing a single, planar copper sheet with a thickness of 20 μm was found to have a permittivity of 1.5. Similar studies performed on wire-containing basic units with two layers of wires (i.e. two sets of 10 wires arranged as above, with the sets of wires arranged in parallel planes) and sheet-containing basic units with two coplanar sheets separated by the same distance showed permissivities of 1.4 and 1.8, respectively.

The elevated dielectric permittivity of basic units containing sheets and the smaller number required to provide an isotropic effect advantageously permits the construction of more effective antennae and RF lenses using such materials. Similarly, such materials can reduce the size required for a device to perform a desired antenna or lens performance, advantageously permitting application to a broader range of devices and environments than permitted by the prior art.

Sheets utilized in the basic units can be made of electrically active materials, including conductive and/or magnetic materials. In some embodiments suitable electrically active materials have both conductive and magnetic properties. Suitable conductive/magnetic materials include copper, nickel, aluminum, silver, ferrous materials, and combinations thereof. The thickness of a sheet of the inventive concept can range from about 3 μm to about 1 mm. In preferred embodiments the thickness of the sheets can range from about 10 μm to about 100 μm. A basic unit can include from 1 to about 20 sheets. In preferred embodiments, a basic unit can include from 1 to 5 sheets.

Optionally, a sheet can include "patches" or discrete areas with different dielectric, magnetic, and/or conductive properties than that of the surrounding sheet material, and such patches can be shaped and distributed in order to optimize the performance of the material (for example, the selection of frequency bands that will experience minimal or low loss). Distribution and composition of sheets and of the patches within such sheets of a basic unit permits fine control of the resulting material's dielectric and magnetic properties. An aggregate of such units with the basic units in random or essentially random orientations can provide a magneto-dielectric material with isotropic performance. Orientations are considered to be effectively or essentially random when they produce a resulting material having an electromagnetic shielding or focusing effect that is at least 80% that of a theoretical effect produced by an analogous material in which the basic units have random orientations relative to one another.

One should appreciate that the disclosed techniques provide many advantageous technical effects including provision of lightweight, readily manufacturable magneto-dielectric materials with highly controllable and reproducible properties, which can be assembled to provide an isotropic effect that is highly suited to use in RF antennae and RF lenses.

Unlike using fibers to create a dielectric material, as disclosed in U.S. Pat. No. 8,518,537 (to Matitsine), by using conductive and/or magnetic sheets that optionally include different patches the magneto-dielectric material of the instant invention can exhibit greatly enhanced dielectric properties and/or controlled magnetic-dielectric properties. In addition, the use of sheets of conductive material provides greatly enhanced dielectric permittivity and reduces the number of basic units necessary to provide isotropic behavior.

Materials of the inventive concept can utilize one or more conductive or magnetic sheets imbedded in a matrix (for example, a nonconductive polymer matrix), as shown in FIG. 1. In the example shown in FIG. 1, the basic unit 100 is in the shape of a cube, and includes two conductive sheets 120, arranged parallel to one another and suspended in a nonconductive polymer matrix 110. Such sheets can, for example, be made from conductive films, but can also be made from magnetic films. Such a polymer matrix can be configured as a basic unit of regular shape, for example a cube, sphere, or polyhedron for ease of handling and manufacturing. For example, a basic unit of the inventive concept can be a configured as a cube with a side length that can range from about 0.1 mm to a about 20 mm. In preferred embodiments a linear dimension of a basic unit can range from about 1 mm to about 5 mm. The dimensions and conductivity of the sheet(s) determines the dielectric constant of the material. In use, a plurality of such basic units are utilized in aggregate and their collective behavior provides the desired dielectric or magneto-dielectric effect. In a preferred embodiment of the inventive concept, a plurality of basic units is provided with the basic units in random orientations, in order to provide an isotropic behavior.

In some embodiments a sheet can contain distinct patches or discrete areas that differ in composition or have distinct properties (for example, conductive and/or magnetic properties) that differ from that of the surrounding sheet material, depending upon the desired proprieties of the final material (FIG. 2). FIG. 2 depicts examples of two basic units on the inventive concept, each having a pair of sheets 210 arranged parallel to one another in a matrix 200. The basic unit on the left in FIG. 2 has sheets that include patches 220 having a regular configuration (in this instance, square). It should be appreciated that a variety of regular configurations, including circles, ellipses, and polygons, are suitable for such patches. The basic unit on the right in FIG. 2 has sheets than include patches 230 of irregular shape and size.

Patches incorporated into sheets of the inventive concept can have a variety of shapes, positions, and orientations relative to one another, and can provide control over the frequency bands that will experience minimal or low loss and other properties. In some embodiments, such patches can have compositions, configurations, and/or orientations that provide additional functionality. An example of this is depicted in FIG. 3. The basic unit shown has metallic sheets 310 imbedded in a matrix 300 and arranged parallel to one another, where the sheets include semi-circular (i.e. "broken circle") patches 320 that can act as magnetic resonators. Such magnetic resonator patches provide a material of the inventive concept that incorporates such basic units with both dielectric and magnetic properties. Depending on the shape of these patches, the use of such sheets with patches provides low-loss, low density material that also has magnetic properties.

As noted above, prior art magnetic-dielectric materials consist of patches that have a regular, periodic structure and/or distribution that is not randomly distributed. Materials of the inventive concept are assembled from relatively small basic units (for example, cubes), and each basic unit can contain one or more layers of conductive sheets where each sheet optionally has a period structure of dielectric and magnetic patches. Such basic units are randomly distributed and/or randomly oriented in the final aggregate material (for example, by imbedding them in a polymer matrix) to give it homogeneity, as shown in FIG. 4. As depicted in FIG. 4, the material 400 includes a number of basic units 420 (having structures as described above) imbedded in a material matrix 410 in random or essentially random orientations relative to one another. This advantageously concentrates losses in a narrow frequency band. More importantly since the basic units are randomly distributed the final material can be isotropic. In some embodiments, the material matrix 410 is similar or identical in composition to the matrix of the imbedded basic units. In order to minimize the weight and/or density of the final material, the individual basic units can be produced using a low density material as a matrix for imbedding the sheets, such as expanded polyester, polyurethane, and/or polystyrene foam with a typical density of around 0.01 to 0.02 g/cm$^3$, with the material matrix (in which the individual basic units are imbedded) being the same or a similar low density material.

As noted above, each basic unit can include one or more conductive and/or magnetic sheets. Conductive sheets can be made from any suitable conductive material. In some embodiments the sheets are composed of highly conductive metal, for example copper, silver, gold, aluminum, nickel, or alloys thereof. Alternatively, such sheets can be magnetic films. Similarly, the patches of such sheets (if any) can be of any suitable conductive and/or magnetic material that differs from that of the surrounding sheet material. The dimensions of a conductive sheet can be selected to provide optimal utility within the desired operating frequency of a device that utilizes the magnetic-dielectric material. In a preferred embodiment a linear dimension of such a sheet can be approximately 1/20 of the wavelength of such a frequency. The thickness of such sheets can range from about 0.005 mm to about 1 mm. In other embodiments the thickness of a sheet can range from about 0.010 mm to about 0.2 mm. In still other embodiments the thickness of a sheet can range from about 0.015 mm to about 0.1 mm. In a preferred embodiment of the inventive concept the thickness of a sheet can range from about 0.02 mm to about 0.05 mm. To reduce weight, it is preferable to utilize conductive sheets with smaller thicknesses. In preferred embodiments of the inventive concept the skin depth for an operating frequency of a device utilizing the dielectric or magnetic-dielectric material should be much greater than the thickness of the conductive sheets.

While shown herein as essentially square, the sheets of the instant invention can be of any suitable shape. In some embodiments sheets of the inventive concept can have a thickness as described above and linear dimension that provide major and minor axes that are essentially identical (for example, a square or circular plane). In other embodiments, the major and minor axes of a sheet can be different (for example, a rectangular or ellipsoidal plane). Similarly, in some embodiments the geometry of the basic unit that encompasses a sheet of the inventive concept can reproduce the geometry of the imbedded sheet with an additional linear dimension (for example, a cube-shaped basic unit incorporating one or more square sheets or a spherical basic unit incorporating a circular sheet). Alternatively, in other embodiments the geometry of the basic unit does not mirror that of the associated sheets (for example, a spherical basic unit incorporating one or more square sheets).

In some embodiments each basic unit includes a periodic structure (array) of such sheets. This structure can have different configurations in order to achieve different dielectric and/or magnetic properties. The number of sheets used per basic unit is a function of the absolute values of dielectric permittivity and/or effect on the magnetic properties of the material. In addition, the structure of each sheet (e.g. the types of patches used or type of sheet used) will be responsible for the position of magnetic resonance and as a result have an effect on the magnetic properties of the material. The number of sheets can also change depending on required properties.

Within a single basic unit each layer of sheet can have differently configured patches (for example, square, circular, semi-circular, etc.) to provide a range of magnetic properties, and each sheet can have different magnetic properties (depending on what types of patches are used on each), as shown in FIG. 5. FIG. 5 depicts a basic unit 500 that includes two parallel sheets 510, 520 imbedded in a matrix 530. As shown, the upper sheet 510 includes irregular patches 540, and the lower sheet 520 includes semi-circular patches 550 that enable magnetic resonance. This advantageously further broadens the range of magnetic properties achievable with materials of the inventive concept. In addition, each sheet can be different in terms of composition, for example metal film, magnetic film, etc. The size of the basic unit and/or the number of sheets within a basic unit can be varied and optimized for the desired performance.

Basic units can be manufactured by any suitable process that provides regular geometric shapes that include one or more sheets in distinct layers. By way of example, such basic units can be manufactured by imbedding a one or more pre-formed sheets, foils, or films with the desired composition, patches (if any), thickness, etc. in a low density polymer matrix in a layered fashion at the desired spacing as a single slab precursor. Alternatively, such sheets, foils, or films can be generated in situ during the manufacturing process, for example by sputtering or vapor deposition onto a polymer matrix or by deposition of particulates onto a suitable matrix followed by fusion of the particulates. Additional matrix material can then be applied to build up the laminar structure in the desired fashion and to the desired thickness. Once the desired conductive layers have been arranged within the matrix, basic units can be produced from the single slab precursor by cutting or slicing, for example with a blade, laser, ultrasound, air knife, water jet, or other suitable device or method to provide a number of basic units of consistent size and regular geometric shape (for example, a cube).

The final magnetic-dielectric material can be assembled by imbedding these basic units in a polymer matrix with a homogeneous distribution and with random or essentially random orientations relative to one another. For example, a number of basic units can be introduced to a container configured with an interior shape and dimensions of the desired final form. Addition of the components of an expanding foam formulation followed by closure of the container and movement (i.e. rolling and/or tumbling) as the foam expands and sets can provide a matrix with imbedded basic units with homogeneous distribution and random or essentially random orientations relative to one another. Alternatively, such a process can be used to generate a block of material that is then cut or otherwise shaped to give a material with the desired final shape and dimensions. In some embodiments of the inventive concept the polymer matrix utilized for imbedding the basic units can be the same polymer matrix utilized in production of the single slab precursor.

It should be apparent to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc.

What is claimed is:

1. A method for manufacturing a magnetic-dielectric material, comprising:

providing an first layer having a planar surface and comprising an insulating matrix;

applying a second layer comprising a first electrically active material as a planar sheet on the planar surface of the first layer, wherein the planar sheet does not comprise spaced wires of electrically active material;

applying a third layer comprising the insulating matrix to the second layer to generate a laminar intermediate;

dividing the laminar intermediate into a plurality of basic units; and imbedding the plurality of basic units in a material matrix, such that the basic units are oriented in an essentially random fashion relative to one another.

2. The method of claim 1, wherein the second layer is applied as a continuous sheet.

3. The method of claim 1, wherein the second layer is applied by sputtering.

4. The method of claim 1, wherein the second layer is applied by depositing particulates of the first electrically active material on the planar surface of the first layer.

5. The method of claim 1, wherein the laminar intermediate is divided by cutting.

6. The method of claim 1, wherein the first electrically active material is conductive.

7. The method of claim 1, wherein the first electrically active material is magnetic.

8. The method of claim 1, wherein the first electrically active material comprises a patch, wherein the patch comprises a second electrically active material with conductive or magnetic properties that are distinct from the first electrically active material.

9. The method of claim 8, wherein the second electrically active material comprises ferrous materials.

10. The method of claim 1, comprising the additional steps of:

applying a fourth layer comprising a third electrically active material to the third layer; and applying a fifth layer comprising the insulating matrix, to the fourth layer.

11. The method of claim 10, wherein the third electrically active material has conductive or magnetic properties that are distinct from the first electrically active material.

12. The method of claim 1, wherein the first electrically active material comprises ferrous materials.

* * * * *